(12) United States Patent
Nakaoka et al.

(10) Patent No.: US 11,171,020 B2
(45) Date of Patent: Nov. 9, 2021

(54) SUBSTRATE TREATMENT APPARATUS

(71) Applicant: TOSHIBA MEMORY CORPORATION, Minato-ku (JP)

(72) Inventors: Satoshi Nakaoka, Yokkaichi (JP); Katsuhiro Sato, Yokkaichi (JP); Hiroaki Ashidate, Mie (JP); Shinsuke Muraki, Kuwana (JP); Yuji Hashimoto, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/548,263

(22) Filed: Aug. 22, 2019

(65) Prior Publication Data

US 2020/0273726 A1    Aug. 27, 2020

(30) Foreign Application Priority Data

Feb. 27, 2019    (JP) .............................. JP2019-034091

(51) Int. Cl.
*H01L 21/67* (2006.01)
*H01L 21/311* (2006.01)

(52) U.S. Cl.
CPC .. *H01L 21/67063* (2013.01); *H01L 21/31111* (2013.01); *H01L 21/67028* (2013.01)

(58) Field of Classification Search
None
See application file for complete search history.

(56) References Cited

U.S. PATENT DOCUMENTS

| 6,258,205 | B1* | 7/2001 | Chisholm | B24B 37/04 |
| | | | | 156/345.16 |
| 6,749,716 | B2* | 6/2004 | Ottow | H01L 21/31111 |
| | | | | 134/113 |
| 6,780,277 | B2* | 8/2004 | Yokomizo | H01L 21/31111 |
| | | | | 156/345.11 |
| 6,790,286 | B2* | 9/2004 | Nishimura | H01L 21/67178 |
| | | | | 118/52 |
| 6,899,784 | B1* | 5/2005 | Li | B24B 37/0056 |
| | | | | 156/345.16 |
| 8,262,845 | B2* | 9/2012 | Doni | H01L 21/31111 |
| | | | | 156/345.15 |
| 8,282,766 | B2* | 10/2012 | Eilmsteiner | H01L 21/31111 |
| | | | | 156/345.18 |
| 9,339,914 | B2* | 5/2016 | Yavelberg | B24B 57/02 |

(Continued)

FOREIGN PATENT DOCUMENTS

| JP | 63-26386 A | 2/1988 |
| JP | 6-151407 A | 5/1994 |

(Continued)

*Primary Examiner* — Sylvia MacArthur
(74) *Attorney, Agent, or Firm* — Oblon, McClelland, Maier & Neustadt, L.L.P.

(57) ABSTRACT

A substrate treatment apparatus according to an embodiment includes a treatment tank, a container, a measuring instrument, and a controller. The treatment tank stores a chemical solution to treat a substrate. The container contains a liquid including ammonia from which a gas discharged from the treatment tank is gas-liquid separated. The measuring instrument measures an amount of the ammonia included in the liquid over time. The controller controls the treatment of the substrate based on the amount of the ammonia.

2 Claims, 6 Drawing Sheets

(56) References Cited

U.S. PATENT DOCUMENTS

| | | |
|---|---|---|
| 9,431,277 B2 | 8/2016 | Hinode et al. |
| 2005/0092351 A1* | 5/2005 | Saito .................. H01L 21/6708 134/33 |
| 2008/0073030 A1 | 3/2008 | Yoshino |
| 2015/0093906 A1* | 4/2015 | Kobayashi ........ H01L 21/31111 438/748 |
| 2016/0042981 A1* | 2/2016 | Sato ................ H01L 21/67086 134/18 |
| 2016/0064257 A1* | 3/2016 | Nonaka .............. H01L 21/6708 134/18 |
| 2017/0309501 A1 | 10/2017 | Kitamura et al. |
| 2018/0082862 A1 | 3/2018 | Ashidate et al. |
| 2018/0233383 A1 | 8/2018 | Ashidate et al. |
| 2019/0259639 A1 | 8/2019 | Nakaoka et al. |
| 2020/0273726 A1* | 8/2020 | Nakaoka ........... H01L 21/67028 |

FOREIGN PATENT DOCUMENTS

| | | |
|---|---|---|
| JP | 2000-147474 A | 5/2000 |
| JP | 3760896 B2 | 3/2006 |
| JP | 2008-41676 A | 2/2008 |
| JP | 2008-84903 A | 4/2008 |
| JP | 2008-147637 A | 6/2008 |
| JP | 2010-103379 A | 5/2010 |
| JP | 2010-129884 A | 6/2010 |
| JP | 2015-115456 A | 6/2015 |
| JP | 2017-69529 A | 4/2017 |
| JP | 2017-195338 A | 10/2017 |
| JP | 2018-46262 A | 3/2018 |
| JP | 2018-133551 A | 8/2018 |
| JP | 2019-145686 A | 8/2019 |
| JP | 2020-21822 A | 2/2020 |

* cited by examiner

SUBSTRATE TREATMENT APPARATUS

CROSS-REFERENCE TO RELATED APPLICATIONS

This application is based upon and claims the benefit of priority from Japanese Patent Application No. 2019-034091, filed on Feb. 27, 2019; the entire contents of which are incorporated herein by reference.

FIELD

Embodiments of the present invention relate to a substrate treatment apparatus and a manufacturing method of a semiconductor device.

BACKGROUND

A manufacturing process of a semiconductor device may include immersing a substrate into a chemical solution and etching a film formed on the substrate.

DETAILED DESCRIPTION

Embodiments will now be explained with reference to the accompanying drawings. The present invention is not limited to the embodiments.

A substrate treatment apparatus according to an embodiment includes a treatment tank, a container, a measuring instrument, and a controller. The treatment tank stores a chemical solution to treat a substrate. The container contains a liquid including ammonia from which a gas discharged from the treatment tank is gas-liquid separated. The measuring instrument measures an amount of the ammonia included in the liquid over time. The controller controls the treatment of the substrate based on the amount of the ammonia.

In conventional case, when treatment conditions such as a treatment time and a concentration of the chemical solution are uniformly fixed, it may not be possible to cope with etching variation.

First Embodiment

Figure 1:
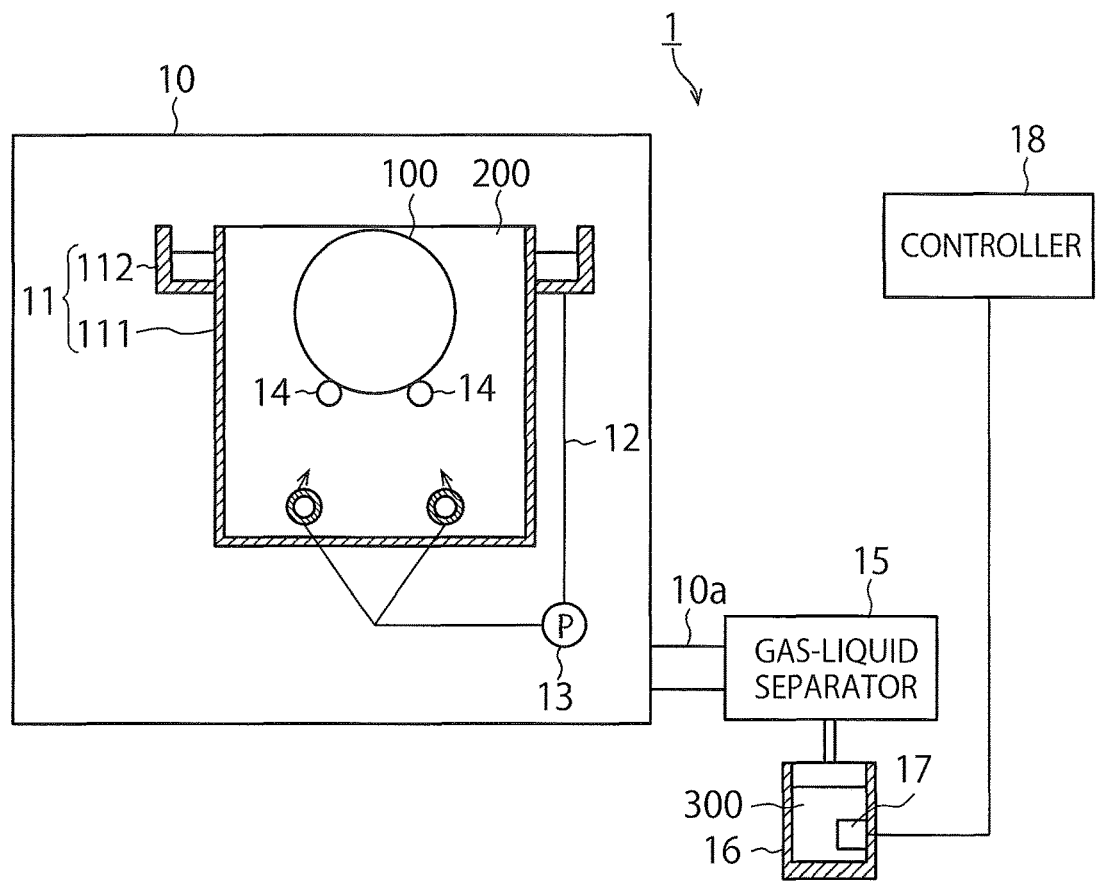
FIG. 1 is a schematic view schematically showing a configuration of a substrate treatment apparatus according to a first embodiment.

FIG. 1 is a schematic view schematically showing a configuration of a substrate treatment apparatus according to a first embodiment. A substrate treatment apparatus 1 shown in FIG. 1 is a batch type of wet etching treatment device that collectively and selectively etches a silicon nitride film (not shown) formed on each of a plurality of semiconductor substrates 100, with a chemical solution 200. The substrate treatment apparatus 1 according to the present embodiment includes a chamber 10, a treatment tank 11, a circulation path 12, a pump 13, a lifter 14, a gas-liquid separator 15, a container 16, a measuring instrument 17, and a controller 18.

The chamber 10 contains the treatment tank 11, the circulation path 12, and the pump 13. Furthermore, a discharge port 10a is provided in a bottom of a side surface of the chamber 10.

The treatment tank 11 has an inner tank 111 and an outer tank 112. An upper end of the inner tank 111 and an upper end of the outer tank 112 are open. The chemical solution 200 is stored in the inner tank 111. In the present embodiment, a phosphoric acid solution heated at about 160° C. is stored in the inner tank 111. The outer tank 112 recovers the chemical solution 200 that overflows from the inner tank 111.

The circulation path 12 communicates with a bottom of the outer tank 112 and a bottom of the inner tank 111, to circulate the chemical solution 200 between the inner tank 111 and the outer tank 112. The chemical solution 200 flowing out to the outer tank 112 is refluxed through the circulation path 12 to the inner tank 111.

The pump 13 is provided in the circulation path 12. The pump 13 suctions the chemical solution 200 from the outer tank 112, and pressurizes the suctioned chemical solution 200. Consequently, the chemical solution 200 recovered in the outer tank 112 returns to the inner tank 111.

Figure 2:
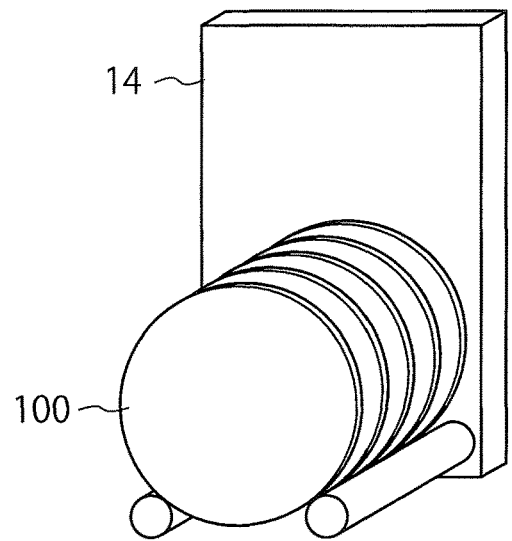
FIG. 2 is a perspective view showing an example of a holding configuration of a semiconductor substrate.

FIG. 2 is a perspective view showing an example of a holding configuration of the semiconductor substrate 100. In the inner tank 111, the lifter 14 holds a plurality of semiconductor substrates 100. Furthermore, the lifter 14 raises and lowers the held semiconductor substrate 100 in a vertical direction from the inner tank 111. By these raising and lowering operations, the semiconductor substrate 100 prior to an etching treatment can be automatically immersed into the chemical solution 200 stored in the inner tank 111, and the semiconductor substrate 100 subjected to the etching treatment can be automatically removed from the inner tank 111.

As shown in FIG. 1, the gas-liquid separator 15 condenses a gas discharged from the discharge port 10a of the chamber 10. Subsequently, the gas-liquid separator 15 supplies, to the container 16, a liquid including ammonia from which the gas is gas-liquid separated, through the condensing, while discharging the gas.

The container 16 stores a liquid 300 including ammonia and supplied from the gas-liquid separator 15. Furthermore, when an amount of the stored liquid 300 is in excess of an upper limit amount, the container 16 discharges the liquid 300.

The measuring instrument 17 measures an amount of the ammonia included in the liquid 300, in the container 16. The amount of the ammonia corresponds to, for example, a pH, a conductivity and a specific resistance of the liquid 300. Therefore, the measuring instrument measures one of the above described physical quantities, thereby measuring the amount of the ammonia. As the amount of the ammonia increases, the pH and conductivity of the liquid 300 increase, and the specific resistance decreases.

The controller 18 controls the treatment of the semiconductor substrate 100 based on the amount of the ammonia measured with the measuring instrument 17. In the present embodiment, the controller 18 determines end time of a treatment of immersing the semiconductor substrate 100 into the chemical solution 200.

Hereinafter, description will be made as to a manufacturing process of a semiconductor device in which the substrate treatment apparatus 1 according to the present embodiment is used. Specifically, description will be made as to a part of the manufacturing process of a three-dimensional semiconductor memory device in which electrode layers are laminated.

Figure 3A:
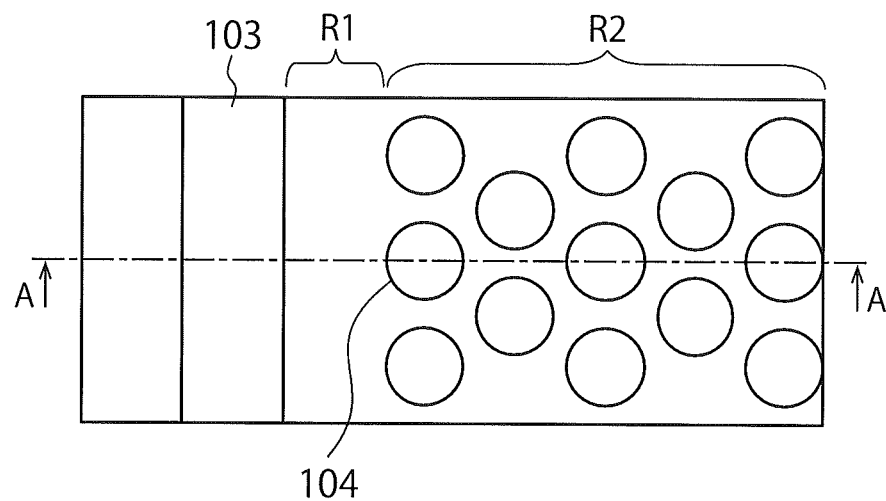
FIG. 3A is a plan view of a semiconductor device prior to etching.
Figure 3B:
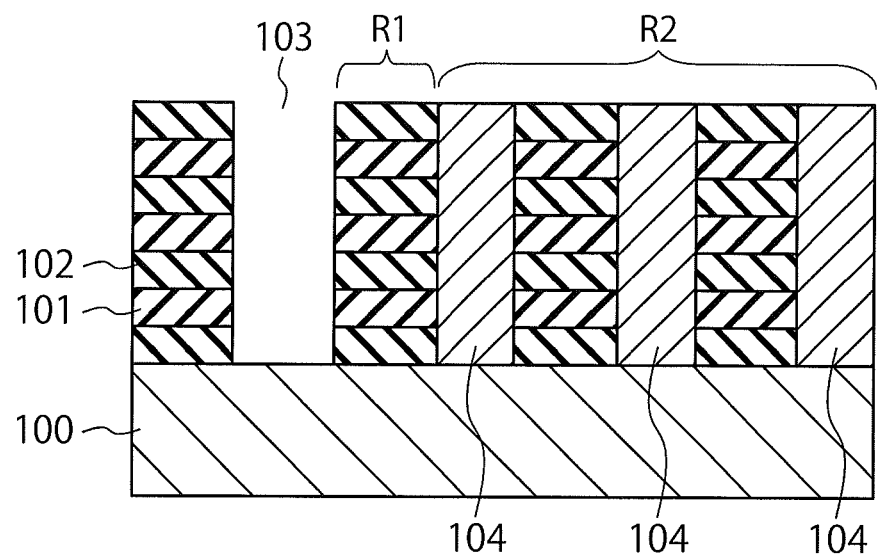
FIG. 3B is a cross-sectional view taken along a cut line A-A shown in FIG. 3A.

FIG. 3A is a plan view of the semiconductor device prior to etching. FIG. 3B is a cross-sectional view taken along a cut line A-A shown in FIG. 3A. As shown in FIG. 3B, silicon nitride films 101 and silicon oxide films 102 are alternately laminated on the semiconductor substrate 100. A laminate including the silicon nitride films 101 and the silicon oxide films 102 is separated by a slit 103. Furthermore, a plurality of pillar-like memory films 104 are formed in this laminate.

Figure 4:
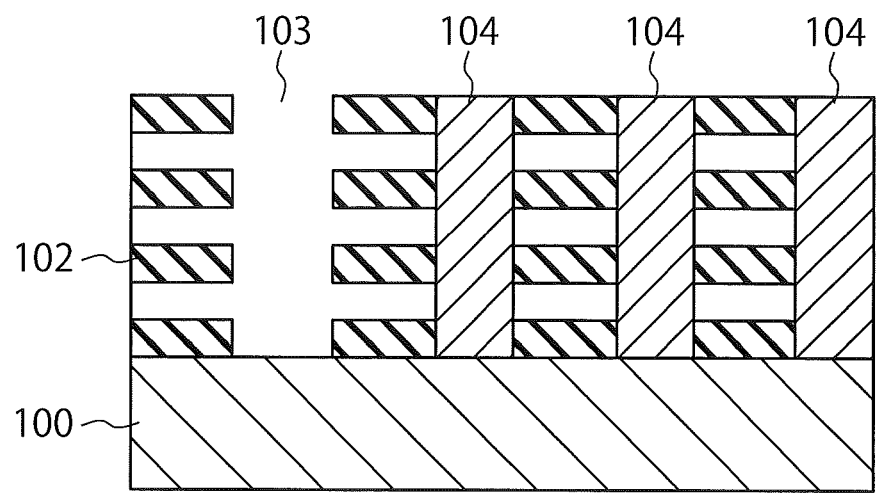
FIG. 4 is a cross-sectional view of the etched semiconductor device.

When the semiconductor substrate 100 is immersed into the chemical solution 200 stored in the inner tank 111 by use of the lifter 14, the chemical solution 200 permeates from the slit 103 into the laminate. As a result, the silicon nitride films 101 are selectively etched to the silicon oxide films 102 as in a cross-sectional view shown in FIG. 4. When the etching of the silicon nitride films 101 ends, the semiconductor substrate 100 is lifted out from the inner tank 111 by the lifter 14.

During this etching of the above described silicon nitride films 101, ammonia is generated as a by-product by a chemical reaction represented by $Si_3N_4 + 12H_2O \rightarrow 3Si(OH)_4 + 4NH_3$. Furthermore, a water content of the chemical solution 200 is evaporated to also generate water vapor. The ammonia and water vapor are discharged as an exhaust gas from the discharge port 10a of the chamber 10.

The gas-liquid separator 15 condenses the above exhaust gas to generate the liquid 300 including ammonia, and the liquid is contained in the container 16. In the container 16, the measuring instrument 17 measures the amount of the ammonia included in the liquid 300.

Figure 5:
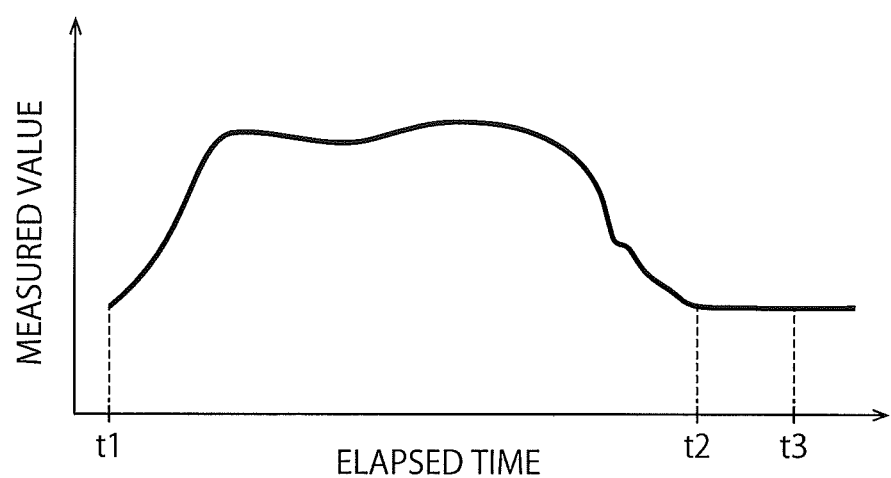
FIG. 5 is a graph showing change of a measured value of a measuring instrument over time.

FIG. 5 is a graph showing change of a measured value of the measuring instrument 17 over time. In FIG. 5, the abscissa indicates a time elapsed from start of the treatment of the semiconductor substrate 100. The ordinate indicates the measured value of the measuring instrument 17, i.e., the pH or the conductivity of the chemical solution 200.

As shown in FIG. 5, when the etching of the silicon nitride films 101 is started at time t1, ammonia is generated, and hence, the measured value of the measuring instrument 17 increases. Afterward, when the etching of the silicon nitride films 101 proceeds, an amount of generated ammonia decreases, and hence, the measured value of the measuring instrument 17 decreases.

The measured value of the measuring instrument 17 is input into the controller 18. Upon confirming the decrease in the measured value at time t2, the controller 18 determines end of the etching at time t3 after elapse of a given time from the time t2. In response to this determining, the semiconductor substrate 100 is removed from the inner tank 111 by the lifter 14.

According to the above described present embodiment, the measuring instrument 17 measures the amount of ammonia generated by the etching of the silicon nitride films 101, so that the controller 18 can grasp a proceeding state of the etching of the silicon nitride films 101. Therefore, the end time of the etching can be set to optimum end time for each of the semiconductor substrates 100. Furthermore, it is not necessary to set a margin of a treatment time by taking etching variation into consideration, and hence, it is possible to improve device throughput.

Second Embodiment

Figure 6:
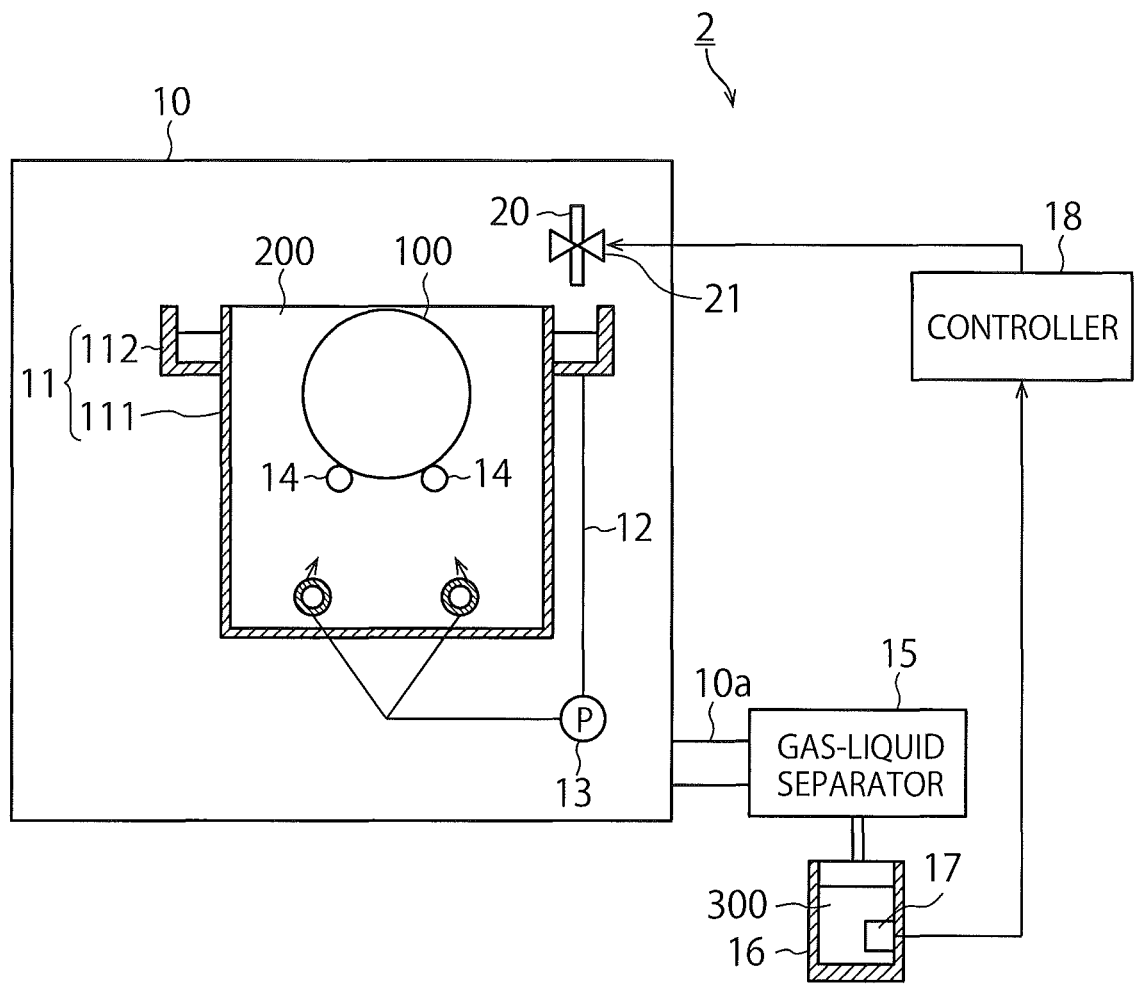
FIG. 6 is a schematic view showing a schematic configuration of a substrate treatment apparatus according to a second embodiment.

FIG. 6 is a schematic view showing a schematic configuration of a substrate treatment apparatus according to a second embodiment. Components similar to those of the above described first embodiment are denoted with the same reference signs, and detailed description is omitted.

A substrate treatment apparatus 2 shown in FIG. 6 includes a supply tube 20 and an adjusting valve 21 in addition to the configuration of the substrate treatment apparatus 1 according to the first embodiment. Through the supply tube 20, phosphoric acid is supplied to an outer tank 112. Furthermore, a flow rate of phosphoric acid to be supplied through the supply tube 20 to the outer tank 112 is adjusted with the adjusting valve 21 under control of a controller 18.

When a semiconductor device shown in FIG. 3A and FIG. 3B is immersed into a chemical solution 200, silicon nitride films 101 of a region R1 in the vicinity of a slit 103 are first etched. During the etching of the region R1, much silica and ammonia are generated. When a concentration of silica in the chemical solution 200 increases, a selecting ratio of silicon nitride to silicon oxide increases, and hence, silica is easy to be precipitated.

To solve the problem, the controller 18 opens the adjusting valve 21, when a measured value of a measuring instrument 17 is in excess of a threshold set in advance after the start of the etching. Consequently, phosphoric acid is supplied to the outer tank 112. This phosphoric acid is added into an inner tank 111 through a circulation path 12. Consequently, the concentration of silica in the chemical solution 200 decreases, and hence, the above selecting ratio decreases. As a result, silica can be inhibited from being precipitated.

At the end of the etching of the region R1, etching of a memory region R2 adjacent to the region R1 is then started. A plurality of memory films 104 are formed in the memory region R2, and hence, an amount of the silicon nitride films 101 to be etched decreases. Consequently, an amount of generated silica and ammonia decreases. As a result, silica is inhibited from being precipitated, while not only the silicon nitride films 101 but also silicon oxide films 102 are etched due to a low selecting ratio.

To solve the problem, the controller 18 controls the adjusting valve 21 to decrease the flow rate of phosphoric acid, when the measured value of the measuring instrument 17 decreases below the above threshold. Consequently, an amount of phosphoric acid to be added into the inner tank 111 from the outer tank 112 decreases, and hence, the concentration of silica in the chemical solution 200 increases. As a result, since the selecting ratio of silicon nitride to silicon oxide increases, the etching of the silicon oxide films 102 can be inhibited.

When the etching of the memory region R2 ends, the generation of ammonia also ends. Consequently, the controller 18 determines the end of the etching based on the measured value of the measuring instrument 17 in the same manner as in the first embodiment.

According to the above described present embodiment, the selecting ratio of silicon nitride to silicon oxide can be adjusted for each of semiconductor substrates 100 in accordance with the proceeding state of the etching of the silicon nitride films 101. In consequence, treatment conditions to inhibit the precipitating of silica and the etching of the silicon oxide films 102 can be set to optimum conditions for each of the semiconductor substrates 100.

Third Embodiment

Figure 7:
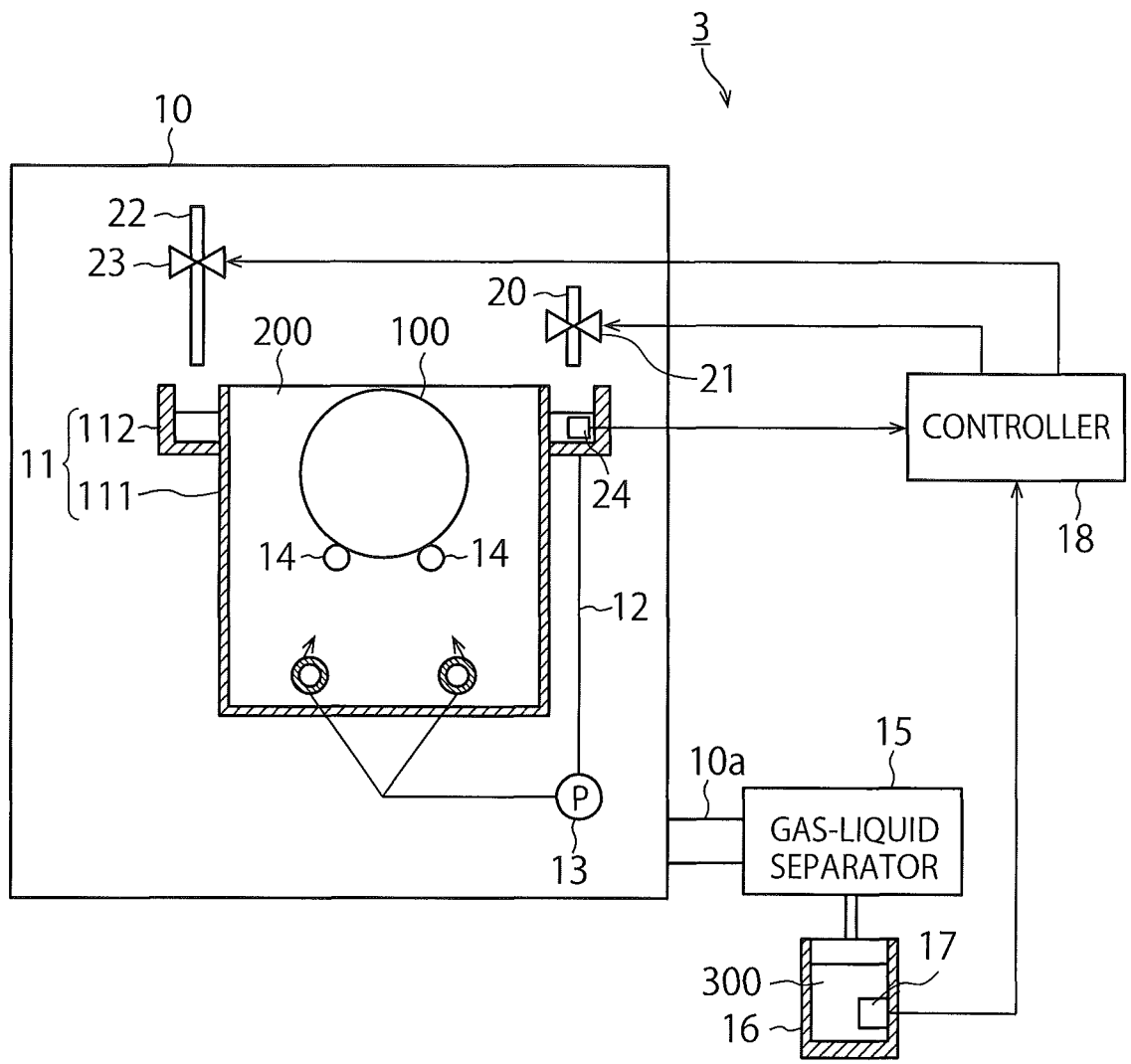
FIG. 7 is a schematic view showing a schematic configuration of a substrate treatment apparatus according to a third embodiment.

FIG. 7 is a schematic view showing a schematic configuration of a substrate treatment apparatus according to a third embodiment. Components similar to those of the above described first and second embodiments are denoted with the same reference signs, and detailed description is omitted.

A substrate treatment apparatus 3 shown in FIG. 7 includes a supply tube 22, an adjusting valve 23, and a silicon densitometer 24 in addition to the configuration of the substrate treatment apparatus 2 according to the second embodiment. Through the supply tube 22, a seasoning solution in which silica is dissolved is supplied to an outer tank 112. Furthermore, a flow rate of the seasoning solution to be supplied through the supply tube 22 to the outer tank 112 is adjusted with the adjusting valve 23 under control of a controller 18. The silicon densitometer 24 measures a concentration of silicon in a chemical solution 200 recovered in the outer tank 112, and outputs a measured result to the controller 18.

When silicon nitride films 101 formed in a semiconductor device shown in FIG. 3A and FIG. 3B are etched with the chemical solution 200, the silicon nitride films 101 of a region R1 are first etched as described in the second embodiment. At this time, much silica and ammonia are generated, and a selecting ratio of silicon nitride to silicon oxide increases. Therefore, silica is easy to be precipitated. Consequently, a measured value of the silicon densitometer 24 also increases.

To solve the problem, the controller 18 opens an adjusting valve 21 and closes the adjusting valve 23 based on a measured value of a measuring instrument 17 and the measured value of the silicon densitometer 24. When the adjusting valve 21 opens, phosphoric acid is added into an inner tank 111 from the outer tank 112 through a circulation path 12. Therefore, the concentration of silica in the chemical solution 200 decreases, and the above selecting ratio decreases. Furthermore, when the adjusting valve 23 closes, the supply of the above seasoning solution is stopped, thereby inhibiting the concentration of silicon from being increased.

Furthermore, during etching of a memory region R2, an amount of generated ammonia decreases. As a result, silica is inhibited from being precipitated, while not only the silicon nitride films 101 but also silicon oxide films 102 are also etched due to a low selecting ratio. Furthermore, the measured value of the silicon densitometer 24 also decreases.

To solve the problem, based on the measured value of the measuring instrument 17 and the measured value of the silicon densitometer 24, the controller 18 controls the adjusting valve 21 and the adjusting valve 23 to decrease a flow rate of phosphoric acid and to increase the flow rate of the seasoning solution. Consequently, the concentration of silica increases, and hence, it is possible to adjust the selecting ratio so that the silicon oxide films 102 are inhibited from being etched. Afterward, the controller 18 determines end of the etching based on the measured value of the measuring instrument 17 in the same manner as in the first embodiment.

According to the above described present embodiment, an adding amount of the seasoning solution in which phosphoric acid and silica are dissolved is changed in accordance with a proceeding state of the etching of the silicon nitride films 101, and accordingly, the selecting ratio of silicon nitride to silicon oxide can be adjusted for each of semiconductor substrates 100. In consequence, treatment conditions to inhibit the precipitating of silica and the etching of the silicon oxide films 102 can be set to optimum conditions for each of the semiconductor substrates 100.

Fourth Embodiment

Figure 8:
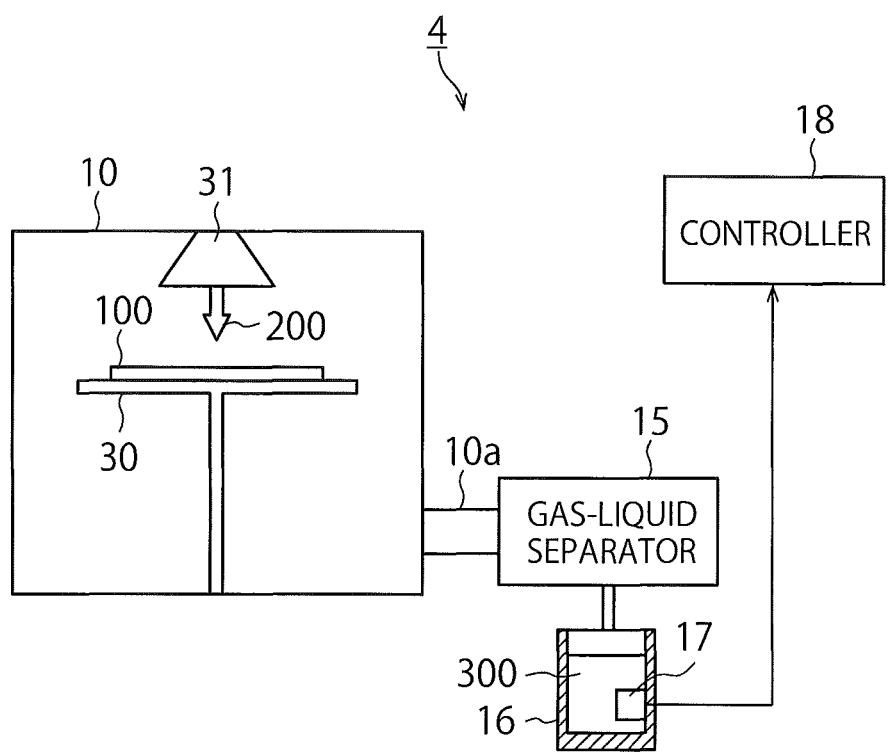
FIG. 8 is a schematic view showing a schematic configuration of a substrate treatment apparatus according to a fourth embodiment.

FIG. 8 is a schematic view showing a schematic configuration of a substrate treatment apparatus according to a fourth embodiment. Components similar to those of the above described first embodiment are denoted with the same reference signs, and detailed description is omitted.

A substrate treatment apparatus 4 shown in FIG. 8 is a so-called single wafer type of wet etching treatment device that etches wafers one by one. The substrate treatment apparatus 4 includes a stage 30 and a nozzle 31 in a chamber 10. A single semiconductor substrate 100 is mounted on the stage 30. Furthermore, the nozzle 31 is installed above the stage 30 to eject a chemical solution 200.

When silicon nitride films 101 formed on the semiconductor substrate 100 are etched with the substrate treatment apparatus 4, the chemical solution 200 that is a high-temperature phosphoric acid solution is ejected from the nozzle 31 toward the semiconductor substrate 100. Consequently, ammonia is generated in the same manner as in the first embodiment.

Ammonia is discharged, together with water vapor generated by evaporating of a water content of the chemical solution 200, from a discharge port 10a of the chamber 10. Afterward, a gas-liquid separator 15 condenses an exhaust gas to generate a liquid 300 including ammonia, and supplies the liquid to a container 16 in the same manner as in the first embodiment.

In the container 16, a measuring instrument 17 measures an amount of the ammonia in the liquid 300, and outputs a measured result to a controller 18. The controller 18 determines end of the etching of the semiconductor substrate 100 based on a measured value of the measuring instrument 17.

According to the above described present embodiment, the measuring instrument 17 measures the amount of ammonia generated by the etching of the silicon nitride films 101, so that the controller 18 can grasp a proceeding state of the etching of the silicon nitride films 101 in the same manner as in the first embodiment. Therefore, end time of the etching can be set to optimum end time for each semiconductor substrate 100. Furthermore, it is not necessary to set a margin of a treatment time by taking etching variation into consideration, and hence, it is possible to improve device throughput.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a treatment tank that stores a phosphoric acid solution to treat a substrate and includes an inner tank and an outer tank,
a container that contains a liquid including ammonia from which a gas discharged from the treatment tank is gas-liquid separated,
a measuring instrument that measures an amount of the ammonia included in the liquid over time,
a controller configured to control a treatment of the substrate based on the amount of the ammonia,
a gas-liquid separator that condenses a gas and supplies, to the container, the liquid including ammonia from which the gas is gas-liquid separated, through the condensing, while discharging the gas,
a first supply tube that supplies phosphoric acid to the outer tank,
a first adjusting valve that adjusts a flow rate of the phosphoric acid supplied to the outer tank through the first supply tube under control of the controller,
a second supply tube that supplies a seasoning solution including silica to the outer tank,
a second adjusting valve that adjusts a flow rate of the seasoning solution supplied to the outer tank through the second supply tube under control of the controller, and
a silicon densitometer configured to measure a concentration of silicon in the phosphoric acid solution recovered in the outer tank and output a measured result to the controller, wherein
the measuring instrument measures one of a pH, a conductivity, and a specific resistance of the liquid over time,
the controller is configured to determine an end time of the treatment of the substrate based on a decrease in the amount of the ammonia,
the controller is configured to adjust an amount of phosphoric acid to be added into the treatment tank in accordance with a change in the amount of the ammonia,
the controller is configured to control an amount of the seasoning solution supplied to the outer tank based on measured values of the measuring instrument and measured values of the silicon densitometer,
the controller opens the first adjusting valve and closes the second adjusting valve based on a measured value of the measuring instrument and a measured value of the silicon densitometer, and
the container stores the liquid supplied from the gas-liquid separator and discharges the liquid when an amount of the stored liquid is in excess of an upper limit amount.

2. The substrate treatment apparatus according to claim 1, wherein
the controller is configured to control an amount of phosphoric acid supplied to the outer tank.

* * * * *